(12) United States Patent
Sato et al.

(10) Patent No.: US 7,435,089 B2
(45) Date of Patent: Oct. 14, 2008

(54) BALLISTIC TRAJECTORY SIMULATION METHOD AND FLIGHT SIMULATION METHOD FOR GOLF BALL

(75) Inventors: Katsunori Sato, Chichibu (JP); Atsuki Kasashima, Chichibu (JP)

(73) Assignee: Bridgestone Sports Co., Ltd., Tokyo (JP)

( * ) Notice: Subject to any disclaimer, the term of this patent is extended or adjusted under 35 U.S.C. 154(b) by 159 days.

(21) Appl. No.: 11/389,259

(22) Filed: Mar. 27, 2006

(65) Prior Publication Data
US 2007/0010342 A1    Jan. 11, 2007

(30) Foreign Application Priority Data
Mar. 29, 2005    (JP) .............................. 2005-094284

(51) Int. Cl.
*A63B 69/36*    (2006.01)
(52) U.S. Cl. ..................................................... 434/252
(58) Field of Classification Search ................. 434/188, 434/247, 252; 473/131, 190, 192, 198, 257, 473/266, 280, 378, 407, 409
See application file for complete search history.

(56) References Cited

U.S. PATENT DOCUMENTS

| | | | | |
|---|---|---|---|---|
| 3,598,976 A * | 8/1971 | Russell et al. | ............... | 473/156 |
| 4,889,341 A * | 12/1989 | Walker | ........................ | 473/165 |
| 5,398,936 A * | 3/1995 | Kluttz et al. | ................. | 473/156 |
| 5,826,874 A * | 10/1998 | Teitell et al. | ................. | 473/225 |
| 5,846,139 A * | 12/1998 | Bair et al. | .................... | 473/156 |
| 6,285,445 B1 * | 9/2001 | Winfield et al. | ............... | 356/28 |
| 6,939,248 B2 * | 9/2005 | Naruo et al. | ................. | 473/324 |
| 7,226,369 B2 * | 6/2007 | Aoyama et al. | ............. | 473/383 |
| 2003/0040894 A1 | 2/2003 | Miyori et al. | | |
| 2003/0109322 A1 * | 6/2003 | Funk et al. | ................... | 473/222 |

FOREIGN PATENT DOCUMENTS

JP    2002-358473 A    12/2002

* cited by examiner

*Primary Examiner*—Kurt Fernstrom
(74) *Attorney, Agent, or Firm*—Sughrue Mion, PLLC

(57) ABSTRACT

A ballistic trajectory method for a golf ball is disclosed wherein a ballistic trajectory of a golf ball having a plurality of dimples formed on the surface thereof when the golf ball is hit to fly at an arbitrary number of rotations and an arbitrary initial speed can be estimated and ballistic trajectory and flight characteristics of the golf ball can be evaluated without depending upon experimental evaluation which is based on an actual model thereby to allow a golf ball to be developed efficiently. The ballistic trajectory of the golf ball when the golf ball is hit to fly is estimated by successively calculating the flight distance and the height of the ball after every lapse of a very short period of time after the ball is hit to fly until it drops to the ground making use of arithmetic operation by a computer.

12 Claims, 7 Drawing Sheets

BALLISTIC TRAJECTORY SIMULATION METHOD AND FLIGHT SIMULATION METHOD FOR GOLF BALL

CROSS-REFERENCE TO RELATED APPLICATION

This non-provisional application claims priority under 35 U.S.C. §119(a) on Patent Application No. 2005-094284 filed in Japan on Mar. 29, 2005, the entire contents of which are hereby incorporated by reference.

BACKGROUND OF THE INVENTION

This invention relates to a ballistic trajectory simulation method wherein a ballistic trajectory of a golf ball having a plurality of dimples formed on the surface thereof is estimated by setting a golf ball model on a computer and making use of arithmetic operation by the computer to calculate kinetic elements of the golf ball model and a flight simulation method wherein a flight state of a golf ball which flies along a trajectory obtained by the ballistic trajectory simulation method is analyzed.

It is known that, when such a physical solid as a golf ball flies in the atmospheric air, turbulence of an air current appears around the physical solid. If the surface of the physical solid has a complicated shape or if the physical solid flies while rotating, then the turbulence of an air current during the flight is complicated and has a significant influence on the flight performance such as the flight distance of the physical solid.

In most cases, a large number of dimples of a circular shape as viewed in plan are provided on a golf ball. Since the combination of a three-dimensional shape, arrangement and size of the dimples has a significant influence on the aerodynamic characteristics of the golf ball, it is necessary to grasp the causal relation between the dimple factors and the aerodynamic characteristics.

Usually, in order to investigate the influence of a change in shape, structure, arrangement or the like of the dimples on the flight performance of the golf ball, various molds for molding golf balls are produced to produce various ball models, and a hitting experiment of the balls is performed to measure the initial speed, spin, ballistic trajectory (flight distance, height) and so forth to evaluate the aerodynamic characteristics.

However, such experimental evaluation based on an actual model as described above requires much time and a high cost and besides fails to precisely indicate the causal relation between the shape and arrangement of the dimples and the aerodynamic characteristics. Therefore, it frequently occurs that a golf ball designed newly based on a result of evaluation obtained by an experiment does not exhibit an intended performance. In such an instance as just described, it is necessary to design and produce a prototype of a ball over again and verify the aerodynamic characteristics of the ball every time, and this requires further increase in time and cost. Therefore, the experimental evaluation described above has a problem in that a ball cannot be developed efficiently.

Japanese Patent Laid-open No. 2002-358473 discloses a simulation method which has some relation to the invention of the present application.

SUMMARY OF THE INVENTION

It is an object of the present invention to provide a method wherein ballistic trajectory and flight characteristics of a golf ball having a plurality of dimples formed on the surface thereof can be evaluated without depending upon experimental evaluation which is based on an actual model thereby to allow a golf ball to be developed efficiently.

In order to attain the object described above, according to an embodiment of the present invention, there is provided a ballistic trajectory simulation method for analyzing a ballistic trajectory when a golf ball having a plurality of dimples formed on the surface thereof is hit to fly making use of arithmetic operation by a computer, including the steps of:

(A) setting, in a virtual space set by the computer, a golf ball model of a substantially spherical shape having a plurality of dimples formed on the surface thereof and an air current virtual region which surrounds the golf ball model;

(B) segmenting the air current virtual region into a large number of lattice segments such that the volume of the lattice segment gradually increases in a direction away from the ball surface of the golf ball model;

(C) setting a state wherein the golf ball model rotates at a predetermined number of rotations and an air current of a predetermined speed flows from forwardly of the golf ball model into the air current virtual region for a very short period of time and using the set state as a state wherein the golf ball rotates at the predetermined number of rotations and flies at the predetermined speed in the atmospheric air for the very short period of time to calculate the speed, direction and pressure of the air current formed in the air current virtual region for each of the lattice segments;

(D) integrating the speeds, directions and pressures of the air current calculated for the individual lattice segments to calculate a lift coefficient and a drag coefficient of the golf ball in the air current virtual region in which the air current is generated;

(E) calculating the flight distance, variation in height and speed of the ball after the golf ball flies for the very short period of time under the gravity from the lift coefficient and the drag coefficient and calculating the number of rotations of the ball after the flight for the very short period of time; and (F) setting the calculated number of rotations and the calculated speed as the number of rotations and the speed after lapse of the very short period of time, respectively;

the operations of (C), (D), (E) and (F) being repeated so that the flight distance and the height of the ball after every lapse of the very short period of time after the ball is hit to fly until the ball drops to the ground are successively calculated to estimate the ballistic trajectory.

According to another embodiment of the present invention, there is provided a ballistic trajectory simulation method for analyzing a ballistic trajectory when a golf ball having a plurality of dimples formed on the surface thereof is hit to fly making use of arithmetic operation by a computer, including the steps of:

(A) setting, in a virtual space set by the computer, a golf ball model of a substantially spherical shape having a plurality of dimples formed on the surface thereof and an air current virtual region which surrounds the golf ball model;

(B) segmenting the air current virtual region into a large number of lattice segments such that the volume of the lattice segment gradually increases in a direction away from the ball surface of the golf ball model;

(C) setting a state wherein the golf ball model rotates at a predetermined number of rotations and an air current of a predetermined speed flows from forwardly of the golf ball model into the air current virtual region for a very short period of time and using the set state as a state wherein the golf ball rotates at the predetermined number of rotations and flies at the predetermined speed in the atmospheric air for the very short period of time to calculate the speed, direction and pressure of the air current formed in the air current virtual region for each of the lattice segments;

(D) integrating the speeds, directions and pressures of the air current calculated for the individual lattice segments to calculate a lift coefficient and a drag coefficient of the golf ball in the air current virtual region in which the air current is generated;

(D-1) repetitively carrying out the operations of (A) to (D) changing the number of rotations of the ball and the speed of the air current and mapping lift coefficients and drag coefficients of the golf ball at the number of rotations of the ball and the speeds of the air current obtained thereby to produce a reference map in advance;

(D-2) deciding the lift coefficient and the drag coefficient at a predetermined number of rotations and a predetermined speed from the reference map;

(E) calculating the flight distance, variation in height and speed of the ball after the golf ball flies for the very short period of time under the gravity from the lift coefficient and the drag coefficient and calculating the number of rotations of the ball after the flight for the very short period of time; and (F-1) setting the calculated number of rotations and the calculated speed as the speed of rotation and the speed after lapse of the very short period of time;

the operations of (D-2), (E) and (F-1) being repeated SO that the flight distance and the height of the ball after every lapse of the very short period of time after the ball is hit to fly until the ball drops to the ground are successively calculated to estimate the ballistic trajectory.

With the ballistic trajectory simulation methods, the ballistic trajectory of a golf ball having a plurality of dimples formed on the surface thereof when the golf ball is hit to fly at an arbitrary number of rotations and an arbitrary initial speed can be estimated without carrying out a test and evaluation based on an actual model.

According to a further embodiment of the present invention, there is provided:

(i) a flight simulation method for a golf ball, including a step of analyzing the flowing direction and the speed of an air current around the golf ball which flies along a ballistic trajectory obtained by visualizing the flowing direction and the speed of the air current around the golf ball with a vector direction and a length, respectively, after every lapse of the very short period of time;

(ii) a flight simulation method for a golf ball, including a step of analyzing the pressure distribution by an air current around the golf ball which flies along a ballistic trajectory obtained by visualizing the pressure distribution of the air current around the golf ball model with a constant pressure line or a constant pressure plane after every lapse of the very short period of time;

(iii) a flight simulation method for a golf ball, including a step of analyzing the vorticity distribution by an air current around the golf ball which flies along a ballistic trajectory obtained by any of the ballistic trajectory simulation methods described above by visualizing the vorticity distribution of the air current around the golf ball model with a constant value line or a constant value plane after every lapse of the very short period of time; and (iv) a flight simulation method for a golf ball, including a step of analyzing the streamlines, path lines, particle traces or volume renderings by an air current around the golf ball which flies along a ballistic trajectory obtained by visualizing the streamlines, path lines, particle traces or volume renderings of the air current around the golf ball model with a constant pressure line or a constant pressure plane after every lapse of the very short period of time.

With the flight simulation methods, a flight state of a golf ball having a plurality of dimples formed on the surface thereof when the golf ball is hit to fly at an arbitrary number of rotations and an arbitrary initial speed can be analyzed and evaluated without carrying out a test and evaluation based on an actual model.

In summary, with the ballistic trajectory simulation methods, the ballistic trajectory of a golf ball having a plurality of dimples formed on the surface thereof when the golf ball is hit to fly at an arbitrary number of rotations and an arbitrary initial speed can be estimated. Meanwhile, with the flight simulation methods, a state of physical properties of an air current around a golf ball and a state of physical properties of a substance around the golf ball arising from the air current such as the flowing direction and speed of the air current, pressure distribution by the air current, vorticity distribution of the air current, streamlines, path lines, particle traces and volume renderings can be evaluated along the ballistic trajectory along which the golf ball flies. Thus, the ballistic trajectory and the flight characteristics of the golf ball having a plurality of dimples formed on the surface thereof can be evaluated without depending upon a test and evaluation based on an actual model. Consequently, a golf ball can be developed efficiently.

As a result, the time required for evaluation of the surface configuration of a golf ball (shape, arrangement, size and so forth of the dimples) is reduced, and also the accuracy and the objectiveness in evaluation are enhanced. Consequently, a product of a higher performance can be developed efficiently in accordance with the type or the grade of the golf ball.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 1A to 1C illustrate a golf ball model and an air current virtual region according a method of the present invention, and wherein FIG. 1A is a conceptive perspective view illustrating an example of a state wherein the golf ball model and the air current virtual region are set in a virtual space, FIG. 1B is a transverse sectional view along a plane including the center of the golf ball shown in FIG. 1A, and FIG. 1C is an enlarged conceptive view of a surface portion of the golf ball model shown in FIG. 1B and a lattice segment in the proximity of the surface of the golf ball;

FIGS. 2A and 2B are views showing an example of a golf ball model according to the present invention, and wherein FIG. 2A shows face segments formed on the surface of the golf ball model and FIG. 2B shows dimples formed on the surface of the golf ball model;

DETAILED DESCRIPTION OF THE PREFERRED EMBODIMENT

In the following, the present invention is described in more detail with reference to the accompanying drawings.

The ballistic trajectory simulation method of the present invention analyzes a ballistic trajectory of a golf ball having a plurality of dimples formed on the surface thereof when the golf ball is hit to fly making use of arithmetic operation by a computer.

In the ballistic trajectory simulation method of the present invention, at first, (A) a golf ball model of a substantially spherical shape having a plurality of dimples formed on the surface thereof and an air current virtual region which surrounds the golf ball model are set in a virtual space set by the computer.

Figure 1A:
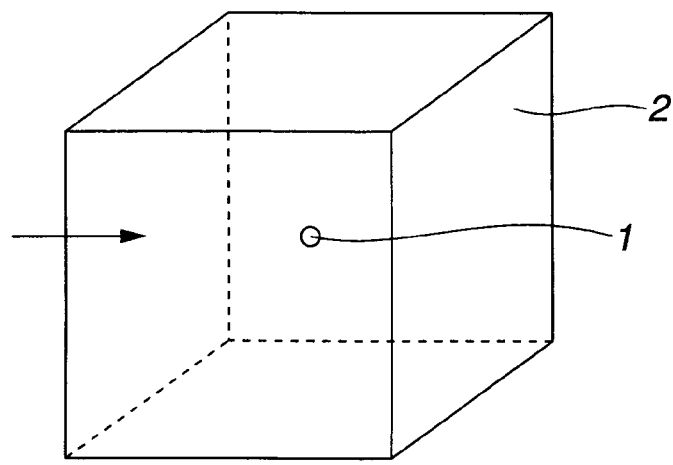
Figure 1B:
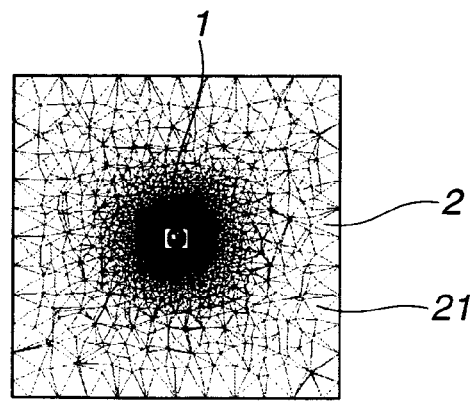

The setting by the computer is illustrated in FIGS. 1A and 1B.

Figure 1C:
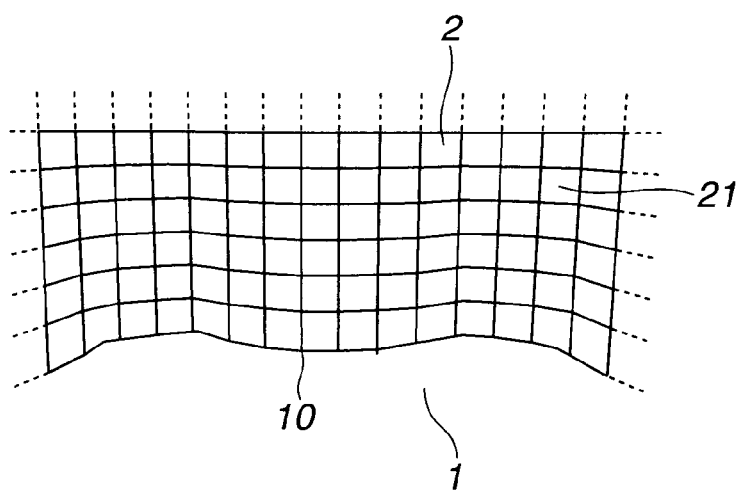

FIG. 1A is a conceptive perspective view illustrating an example of a state wherein the golf ball model and the air current virtual region are set in a virtual space; FIG. 1B is a transverse sectional view along a plane including the center of the golf ball shown in FIG. 1A; and FIG. 1C is an enlarged conceptive view showing an example of a surface portion of the golf ball model shown in FIG. 1B and a lattice segment in the proximity of the surface of the golf ball.

In this instance, a golf ball model 1 and an air current virtual region 2 are set in a virtual space as seen in FIG. 1A. The golf ball model 1 can be produced by 3D CAD, and the air current virtual region 2 can be set as a parallelepiped spanning over ±5 to ±150 times the diameter of the golf ball model 1 in the directions of three-dimensional xyz axes from the center of the golf ball model 1, particularly as a range of a rectangular square. Although it is necessary to set the air current virtual region 2 to a range which covers almost all of the air current around the golf ball which have an influence on the movement of the golf ball, since the air current remote from the golf ball does not have a significant influence on the movement of the golf ball and, if the magnitude of the air current virtual region is excessively small, the simulation accuracy is low, the magnitude of the air current virtual region 2 preferably has the range specified above from the point of view of the efficiency or the accuracy.

Then, (B) the air current virtual region is segmented into a large number of lattice segments such that the volume of the lattice segment gradually increases in a direction away from the ball surface of the golf ball model.

Figure 2A:
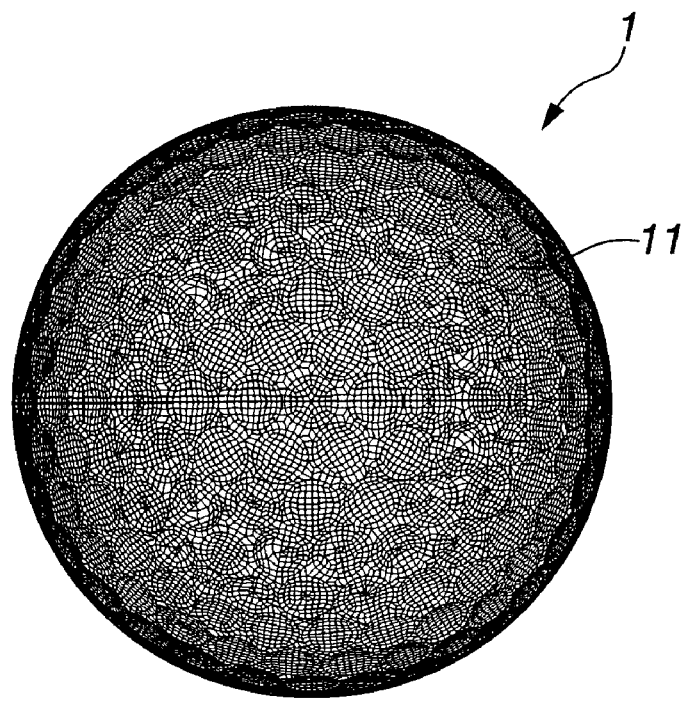

In particular, the surface of the golf ball model 1 is segmented to set a large number of face segments 11 of a polygon such as a triangle or a quadrangle or of a near polygon such as a near triangle or a near quadrangle having a side of approximately 0.002 mm as shown in FIG. 2A. Then, lattice segments 21 adjacent the golf ball model surface 10 on which one face is defined by each of the face segments 11 as shown in FIG. 1C are set. The lattice segments 21 adjacent the golf ball model surface 10 are set to a near polygonal pole shape such as a near quadrangle pole shape or a near polygonal pyramid shape. Then, the remaining portion of the air current virtual region 2 is segmented into lattices such that the volume of the lattice segment 21 gradually increases in a direction away from the golf ball from the lattice segments adjacent the golf ball model surface 10 thereby to segment the overall range of the air current virtual region 2 with the lattice segments 21.

Figure 3A:
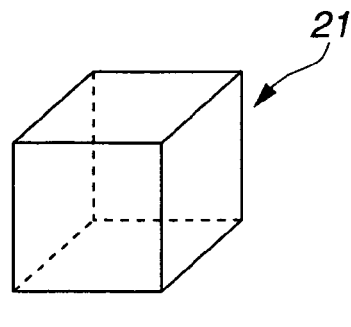
FIGS. 3A to 3D are schematic views showing different examples of the shape of a lattice segment formed in an air current virtual region in the present invention.
Figure 3B:
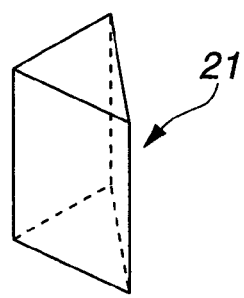
Figure 3C:
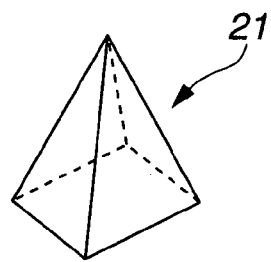
Figure 3D:
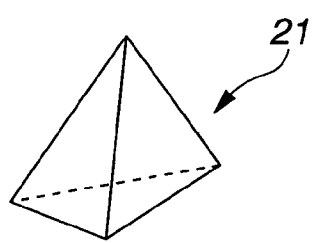

The shape of the lattice segments formed in the remaining portion of the air current virtual region other than the lattice segments adjacent the golf ball model surface 10 may be a polyhedron such as a hexahedron shown in FIG. 3A, a pentahedron like a triangle pole shown in FIG. 3B, a pentahedron like a quadrangular pyramid shown in FIG. 3C or a tetrahedron like a triangular pyramid shown in FIG. 3D, and they may be set in suitable combinations.

Since the air current around the golf ball has an influence more where it is nearer to the golf ball, the lattice segments are set such that they are fine in the proximity of the golf ball model but are rough at remote locations from the golf ball model at which the air current has a less influence as seen in FIG. 1B. It is to be noted that the increase in volume of the lattice segments in a direction away from the ball surface of the golf ball model may be continuous or stepwise.

Then, (C) a state wherein the golf ball model described above rotates at a predetermined number of rotations and an air current of a predetermined speed flows from forwardly of the golf ball model into the air current virtual region described hereinabove for a very short period of time is set, and considering this state as a state wherein the golf ball rotates at the predetermined number of rotations and flies at the predetermined speed in the atmospheric air for the very short period of time, the speed, direction and pressure of the air current formed in the air current virtual region are calculated for each of the lattice segments.

In the ballistic trajectory simulation method of the present invention, a simulation is performed assuming a state wherein a golf ball model rotates at a predetermined number of rotations and an air current of a predetermined speed flows from forwardly of the golf ball model into an air current virtual region for a very short period of time, for example, a state wherein an air current flows in from a direction of an arrow mark in FIG. 1A, as a state wherein the golf ball flies at the predetermined speed in the atmospheric air for the very short period of time.

Then, an analysis of motion elements of the air current in the air current virtual region generated by the force which is caused by the air current blowing against the rotating golf ball model and acting upon the surface of the golf ball is performed for each lattice segment.

The motion elements generated when an air current flows into the air current virtual region and blows against the golf ball model are the speed of the air current in each of the directions of the axes of the three-dimensional spatial coordinate system, the direction of the air current and the pressure of the air current against the ball model surface. The motion elements can be calculated by substituting numerical values into basic equations used for the calculation, that is, an equation of continuity (1) corresponding to the law of conservation of mass and the Navier-Stokes equations (2), (3) and (4) corresponding to the momentum conservation law of a physical solid as given below:

$$\frac{\partial \rho}{\partial t} + \frac{\partial (\rho u)}{\partial x} + \frac{\partial (\rho v)}{\partial y} + \frac{\partial (\rho w)}{\partial z} = 0 \tag{1}$$

where u, v and w are the speeds in the x, y and z directions, respectively.

$$\frac{D_u}{D_t} = F_x - \frac{1}{\rho}\frac{\partial p}{\partial x} + \frac{\mu}{\rho}\left[\frac{\partial_u^2}{\partial_x^2} + \frac{\partial_u^2}{\partial_y^2} + \frac{\partial_u^2}{\partial_z^2}\right] + \frac{1}{3}\frac{\mu}{\rho}\frac{\partial p}{\partial x}\left[\frac{\partial u}{\partial x} + \frac{\partial v}{\partial y} + \frac{\partial w}{\partial z}\right] \tag{2}$$

$$\frac{D_v}{D_t} = F_y - \frac{1}{\rho}\frac{\partial p}{\partial y} + \frac{\mu}{\rho}\left[\frac{\partial_v^2}{\partial_x^2} + \frac{\partial_v^2}{\partial_y^2} + \frac{\partial_v^2}{\partial_z^2}\right] + \frac{1}{3}\frac{\mu}{\rho}\frac{\partial p}{\partial y}\left[\frac{\partial u}{\partial x} + \frac{\partial v}{\partial y} + \frac{\partial w}{\partial z}\right] \tag{3}$$

$$\frac{D_w}{D_t} = F_z - \frac{1}{\rho}\frac{\partial p}{\partial z} + \frac{\mu}{\rho}\left[\frac{\partial_w^2}{\partial_x^2} + \frac{\partial_w^2}{\partial_y^2} + \frac{\partial_w^2}{\partial_z^2}\right] + \frac{1}{3}\frac{\mu}{\rho}\frac{\partial p}{\partial z}\left[\frac{\partial u}{\partial x} + \frac{\partial v}{\partial y} + \frac{\partial w}{\partial z}\right] \tag{4}$$

where $\rho$ is the air density, p the air pressure, and $\mu$ the air viscosity.

In the simulation wherein the air flows in the direction of the arrow mark around the golf ball model 1 as seen in FIG. 1A, the current of the air can be analyzed for each of the lattice segments 21 of the air current virtual region 2 by arithmetic operation. By using the expressions (1) to (4) above for the arithmetic operation, the expressions (1) to (4) can be discretized corresponding to the segmentation of the air current virtual region 2 into the lattice segments 21 to perform the arithmetic operation. The method of the simulation to be used may be selected from among a finite difference calculus, a finite volume method, a boundary element method, a finite element method and so forth.

Thereafter, (D) the speeds, directions and pressures of the air current calculated for the individual lattice segments are integrated to calculate a lift coefficient CL and a drag coefficient CD of the golf ball in the air current virtual region in which the air current is generated.

In this instance, it is possible to calculate, taking the air current as a scattering model, the lift coefficient CL and the drag coefficient CD by substituting speed values determined taking the degree of turbulence into consideration.

Then, (E) the flight distance, variation in height and speed of the ball after the golf ball flies for the very short period of time under the gravity are calculated from the lift coefficient CL and the drag coefficient CD calculated as above, and the number of rotations of the ball after the flight for the very short period of time is calculated.

Figure 4:
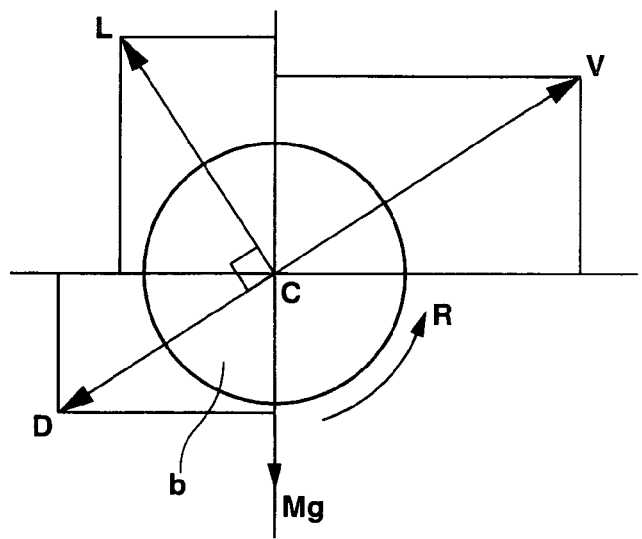
FIG. 4 is a diagrammatic view illustrating different forces acting upon a golf ball when it flies while rotating.

It is known that a golf ball hit by a club to fly is acted upon by the gravity Mg, a drag D by the air and a dynamic lift L by the Magnus effect because the ball has a spin. It is to be noted that, in FIG. 4, reference numeral V denotes the flying direction, c the center of the ball, and in this instance, the golf ball b rotates in the direction indicated by an arrow mark R.

In this instance, the force acting upon the golf ball is represented by the following ballistic trajectory equation (5):

$$F = FL + FD + Mg \tag{5}$$

where F is the force acting upon the golf ball, FL the lift, FD the drag, and Mg the gravity.

Then, the movement of the golf ball can be arithmetically operated in accordance with the following equations of motion:

$$F_{cd} = 0.5 \times CD \times \rho \times A \times V^2 \tag{6}$$

$$F_{cl} = 0.5 \times CL \times \rho \times A \times V^2 \tag{7}$$

$$F_{cd} + F_{cl} + mg = m \times dV/dt \tag{8}$$

where m is the weight of the ball, g the gravitational acceleration, t the time, CL the lift coefficient, CD the drag coefficient, $\rho$ the air density, A the sectional area of the golf ball, and V the speed of the golf ball with respect to the air.

From this, the speed of the golf ball after it flies for the very short period of time is calculated, and further, by applying a result of this to the Newton's equation of motion relating to a parabolic motion, the flight distance and the variation in height of the ball after the flight for the very short period of time can be calculated. The arithmetic operation of the differential expression given above may be performed using the Euler method or the Runge Kutta method, and the speed for the very short period of time can be calculated thereby.

On the other hand, the number of rotations (rotational speed) of the flying golf ball gradually decreases as time passes. However, the number of rotations after lapse of the very short period of time can be calculated in accordance with the following expression:

$$\omega = (\omega_0 \times E_{xp}\{-(SRD_1 + SRD_2 \times V) \times t \times \beta\} \tag{9}$$

$$\beta = (\pi \times \rho \times r^4)/1 \tag{10}$$

where $\omega_0$ is the angular speed of initial rotation of the golf ball, $\omega$ the angular speed of rotation of the golf ball, $\rho$ the air density, r the radius of the golf ball, 1 the moment of inertia of the golf ball, and $SRD_1$ and $SRD_2$ are attenuation coefficients unique to the dimples.

As a result, the flight distance and the variation in height of the ball after the flight for the very short period of time are calculated, and this operation is decided as a first step. Further, (F) the number of rotations and the speed calculated in this manner are set as the number of rotations and the speed after lapse of the very short period of time, respectively, and then, the operations of (C), (D), (E) and (F) are repeated. As a result of the repetitions, the flight distance and the height of the ball after every lapse of the very short period of time after the ball is hit to fly until the ball drops to the ground can be successively calculated to estimate the ballistic trajectory.

It is to be noted that preferably the very short period of time to be set is 0.005 to 0.1 second from the point of view of the efficiency and the accuracy of the simulation.

Figure 2B:
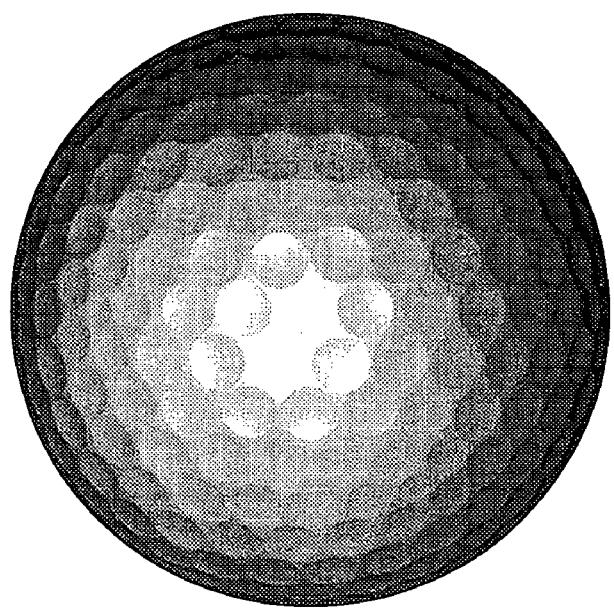
Figure 5:
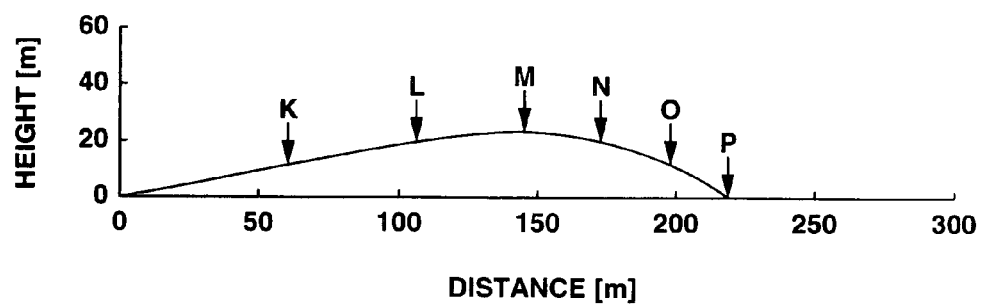
FIG. 5 is a diagram showing an example of a ballistic trajectory of a golf ball estimated by a ballistic trajectory simulation method according to the present invention.

More detailed description is given below. If the golf ball is hit, for example, using a driver (W#1 club), then the golf ball flies along a parabolic ballistic trajectory as seen from FIG. 5. Therefore, in this instance, the initial speed of the hit golf ball is set, for example, to 70 m/s and the spinning amount is set to a predetermined rotational speed, for example, 3,000 rpm, and a lift coefficient CL and a drag coefficient CD are calculated in the conditions that an air current has a speed of 70 m/s and a rotational speed of 3,000 rpm relative to such a rotating and spinning golf ball, which has a plurality of dimples formed on the surface thereof, as shown in FIG. 2B. Then, the expressions (6), (7) and (8) are used to calculate the speed of the golf ball after the flight for one second. Then, if the Newton's equation of motion relating to a parabolic motion is used based on a result of the calculation to calculate the flight distance and the height of the ball after the flight for one second, then a position indicated by K in FIG. 5 is determined by the calculation. Meanwhile, the expressions (9) and (10) are used to calculate the number of rotations of the ball after lapse of one second.

Then, using the speed and the number of rotations of the golf ball after the flight for one second calculated in this manner as the speed and the number of rotations of the ball at the position K in FIG. 5, the flight distance and the height of the ball after lapse of another one second are calculated similarly in accordance with the method described above. In this instance, if the speed and the number of rotations of the ball at the position K in FIG. 5 are, for example, 60 m/s and 2,800 rpm, then another position L in FIG. 5 is calculated depending upon the speed and the number of rotations. Thereafter, positions M, N, 0 and P in FIG. 5 are successively calculated in a similar manner until the golf ball comes to a position at which it drops to the ground. The ballistic trajectory of the golf ball can be obtained from the positions calculated in this manner.

After the operations of (A) to (D) described hereinabove, the following operations may be performed. In particular;
(D-1) the operations of (A) to (D) described above are carried out repetitively changing the number of rotations of the ball and the speed of the air current and lift coefficients and drag coefficients of the golf ball at the number of rotations of the ball and the speeds of the air current obtained by the operations of (A) to (D) are mapped to produce a reference map in advance, and
(D-2) the lift coefficient and the drag coefficient at a predetermined number of rotations and a predetermined speed are decided from the reference map, and then
the operation of (E) described hereinabove is carried out, whereafter
(F-1) the number of rotations and the speed calculated in this manner are set as the speed of rotation and the speed after lapse of the very short period of time, and then
the operations of (D-2), (E) and (F-1) are repeated to simulate the ballistic trajectory.

Figure 6:
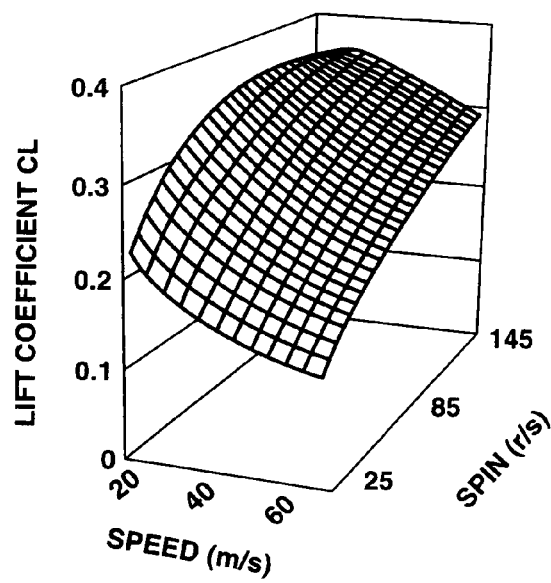
FIG. 6 is a diagrammatic view illustrating an example of a reference map wherein a lift coefficient is mapped with respect to the speed and the number of rotations of a ball.
Figure 7:
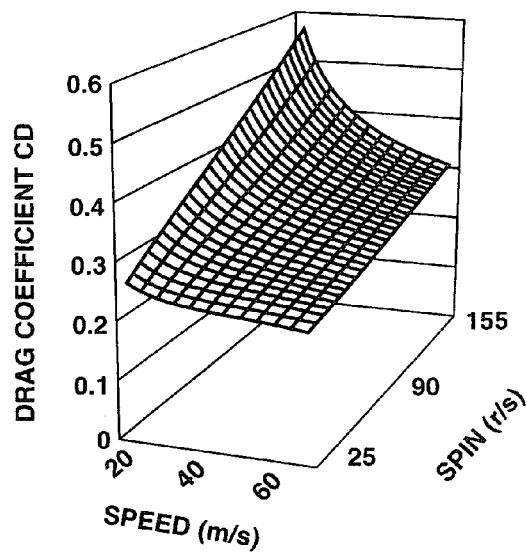
FIG. 7 is a similar view but illustrating an example of a reference map wherein a drag coefficient is mapped with respect to the speed and the number of rotations of a ball.

In this instance, in order to calculate the lift coefficient CL and the drag coefficient CD at the speed and the rotational speed, a reference map may be used. The reference map is produced by repeating the operations of (A) to (D) to calculate the lift coefficient CL and the drag coefficient CD corresponding to a speed and a rotational speed at each of a plurality of points, for example, at each of approximately 10 to several hundreds points at which the speed and the rotational speed are changed within a necessary range in advance with regard to the speed and the number of rotations of the golf ball necessary to simulate the ballistic trajectory of the ball and mapping the lift coefficient CL and the drag coefficient CD of the golf ball at each of the numbers of rotations of the ball and each of the speeds of the air current determined by the calculation in a space which has an X axis of the speed, a Y axis of the number of rotations and a Z axis of the lift coefficient CL (FIG. 6) or the drag coefficient CD (FIG. 7) as seen in FIG. 6 or 7. The method of producing a reference map in advance is effective in that a ballistic trajectory simulation of a golf ball can be carried out simply and conveniently.

Further, also it is possible to analyze a flight state of a golf ball making use of the ballistic trajectory simulation method. In particular;
(i) the flowing direction and the speed of the air current around the golf ball which flies along the ballistic trajectory obtained by the ballistic trajectory simulation method are analyzed by visualizing the flowing direction and the speed of the air current around the golf ball model with a vector direction and a length, respectively, after every lapse of the very short period of time,
(ii) the pressure distribution by the air current around the golf ball which flies along the ballistic trajectory obtained by the ballistic trajectory simulation method described above is analyzed by visualizing the pressure distribution of the air current around the golf ball model with a constant pressure line or a constant pressure plane after every lapse of the very short period of time,
(iii) the vorticity distribution of the air current around the golf ball which flies along the ballistic trajectory obtained by the ballistic trajectory simulation method described above is analyzed by visualizing the vorticity distribution of the air current around the golf ball model with a constant value line or a constant value plane after every lapse of the very short period of time, or
(iv) the streamlines, path lines, particle traces or volume renderings by the air current around the golf ball which flies along the ballistic trajectory obtained by the ballistic trajectory simulation method described above is analyzed by visualizing the streamlines, path lines, particle traces or volume renderings of the air current around the golf ball model after every lapse of the very short period of time.

Figure 8:
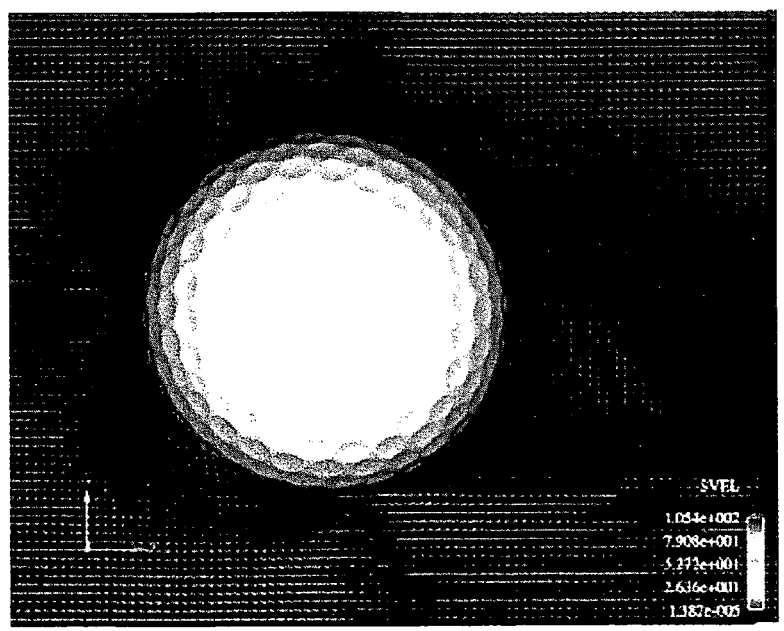
FIG. 8 is a view illustrating the flowing direction and the speed of an air current around the golf ball model at a certain position on a ballistic trajectory shown in FIG. 5 in the form of a vector direction and a length, respectively.
Figure 9:
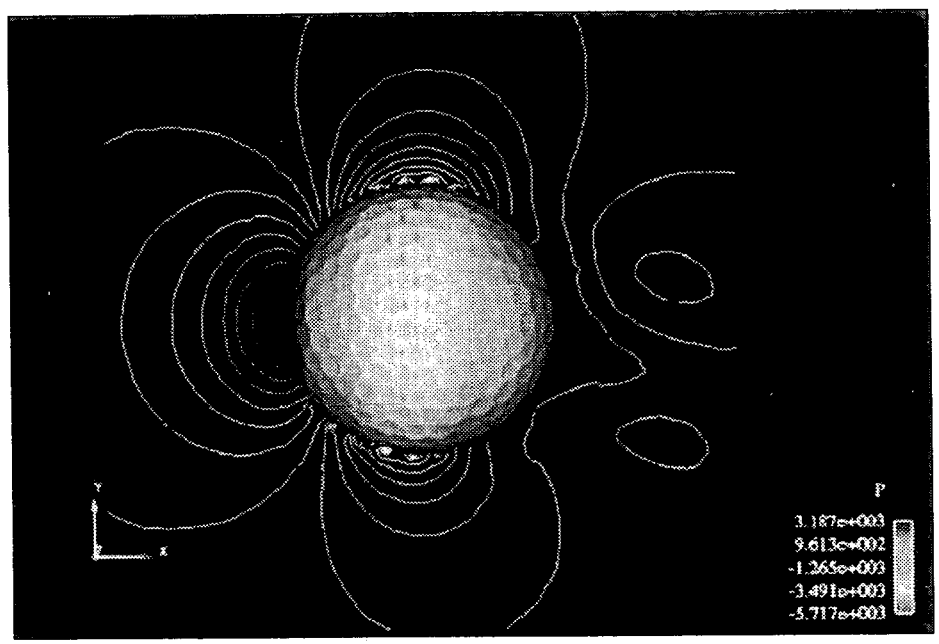
FIG. 9 is a view illustrating a pressure distribution of air around the golf ball model at the certain position on the ballistic trajectory shown in FIG. 5 in the form of constant-pressure lines.
Figure 10:
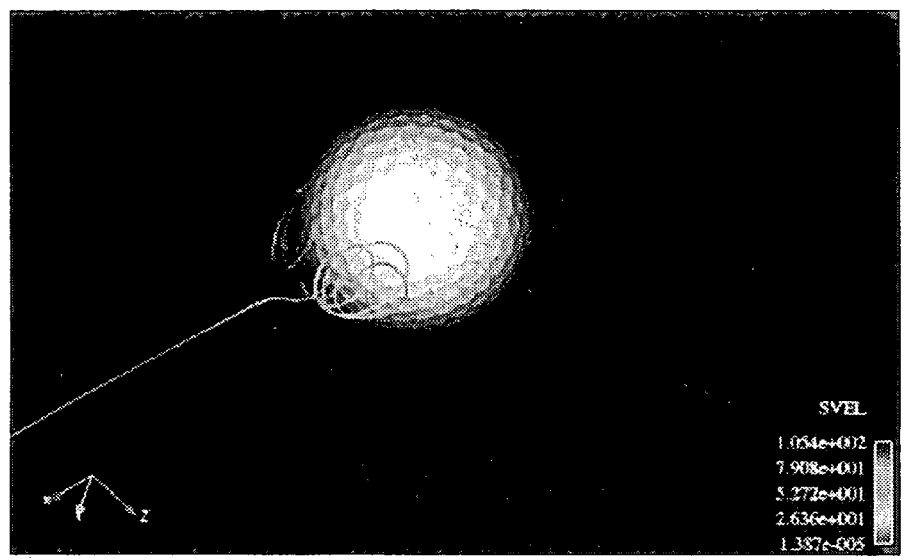
FIG. 10 is a view illustrating a vorticity distribution of an air current around the golf ball model at the certain position on the ballistic trajectory shown in FIG. 5 in the form of constant value lines of the vorticity.
Figure 11:
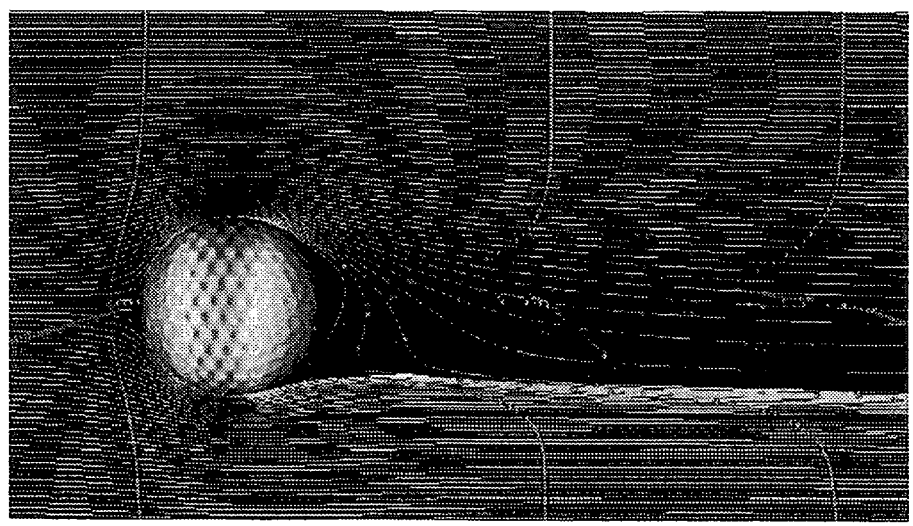
FIG. 11 is a view illustrating stream lines of air around the golf ball model at the certain position on the ballistic trajectory shown in FIG. 5.

A view illustrating the flowing direction and the speed of an air current around the golf ball model at the position K-on the ballistic-trajectory shown in FIG. 5 in the form of a vector direction and a length, respectively, is shown in FIG. 8; a view illustrating a pressure distribution of air around the golf ball model similarly in the form of constant-pressure lines is shown in FIG. 9; a view illustrating a vorticity distribution of an air current around the golf ball model similarly in the form of constant value lines of the vorticity is shown in FIG. 10; and a view illustrating stream lines of air around the golf ball model similarly is shown in FIG. 11.

According to the flight simulation method, a flight state of a golf ball having a plurality of dimples formed on the surface thereof when the golf ball is hit to fly at an arbitrary rotational speed and an arbitrary initial speed can be analyzed and evaluated without carrying out a test and evaluation based on an actual model such as a wind tunnel test. Further, if the analyzed flight state is visualized after every lapse of a very short period of time such that it is visualized successively along the ballistic trajectory of the golf ball, then the flight state of the golf ball can be evaluated successively after the ball is hit to fly until it drops to the ground.

While a preferred embodiment of the present invention has been described using specific terms, such description is for illustrative purposes only, and it is to be understood that changes and variations may be made without departing from the spirit or scope of the following claims.

Japanese Patent Application No. 2005-094284 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A ballistic trajectory simulation method for analyzing a ballistic trajectory when a golf ball having a plurality of dimples formed on the surface thereof is hit to fly making use of arithmetic operation by a computer, comprising the steps of:

(A) setting, in a virtual space set by said computer, a golf ball model of a substantially spherical shape having a plurality of dimples formed on the surface thereof and an air current virtual region which surrounds the golf ball model;

(B) segmenting the air current virtual region into a large number of lattice segments such that the volume of the lattice segment gradually increases in a direction away from the ball surface of the golf ball model;

(C) setting a state wherein the golf ball model rotates at a predetermined number of rotations and an air current of a predetermined speed flows from forwardly of the golf ball model into the air current virtual region for a very short period of time and using the set state as a state wherein the golf ball rotates at the predetermined number of rotations and flies at the predetermined speed in the atmospheric air for the very short period of time to calculate the speed, direction and pressure of the air current formed in the air current virtual region for each of the lattice segments;

(D) integrating the speeds, directions and pressures of the air current calculated for the individual lattice segments to calculate a lift coefficient and a drag coefficient of the golf ball in the air current virtual region in which the air current is generated;

(E) calculating the flight distance, variation in height and speed of the ball after the golf ball flies for the very short period of time under the gravity from the lift coefficient and the drag coefficient and calculating the number of rotations of the ball after the flight for the very short period of time; and (F) setting the calculated number of rotations and the calculated speed as the number of rotations and the speed after lapse of the very short period of time, respectively;

the operations of (C), (D), (E) and (F) being repeated so that the flight distance and the height of the ball after every lapse of the very short period of time after the ball is hit to fly until the ball drops to the ground are successively calculated to estimate the ballistic trajectory.

2. A flight simulation method for a golf ball, comprising a step of analyzing the flowing direction and the speed of an air current around the golf ball which flies along a ballistic trajectory obtained by the ballistic trajectory simulation method according to claim 1 by visualizing the flowing direction and the speed of the air current around the golf ball with a vector direction and a length, respectively, after every lapse of the very short period of time.

3. A flight simulation method for a golf ball, comprising a step of analyzing the pressure distribution by an air current around the golf ball which flies along a ballistic trajectory obtained by the ballistic trajectory simulation method according to claim 1 by visualizing the pressure distribution of the air current around the golf ball model with a constant pressure line or a constant pressure plane after every lapse of the very short period of time.

4. A flight simulation method for a golf ball, comprising a step of analyzing the vorticity distribution by an air current around the golf ball which flies along a ballistic trajectory obtained by the ballistic trajectory simulation method according to claim 1 by visualizing the vorticity distribution of the air current around the golf ball model with a constant value line or a constant value plane after every lapse of the very short period of time.

5. A flight simulation method for a golf ball, comprising a step of analyzing the streamlines, path lines, particle traces or volume renderings by an air current around the golf ball which flies along a ballistic trajectory obtained by the ballistic trajectory simulation method according to claim 1 by visualizing the streamlines, path lines, particle traces or volume renderings of the air current around the golf ball model with a constant pressure line or a constant pressure plane after every lapse of the very short period of time.

6. A flight simulation method for a golf ball according to claim 1, wherein the very short period of time comprises a period of time from 0.005 seconds to 0.1 seconds.

7. A ballistic trajectory simulation method for analyzing a ballistic trajectory when a golf ball having a plurality of dimples formed on the surface thereof is hit to fly making use of arithmetic operation by a computer, comprising the steps of:

(A) setting, in a virtual space set by said computer, a golf ball model of a substantially spherical shape having a plurality of dimples formed on the surface thereof and an air current virtual region which surrounds the golf ball model;

(B) segmenting the air current virtual region into a large number of lattice segments such that the volume of the lattice segment gradually increases in a direction away from the ball surface of the golf ball model;

(C) setting a state wherein the golf ball model rotates at a predetermined number of rotations and an air current of a predetermined speed flows from forwardly of the golf ball model into the air current virtual region for a very short period of time and using the set state as a state wherein the golf ball rotates at the predetermined number of rotations and flies at the predetermined speed in the atmospheric air for the very short period of time to calculate the speed, direction and pressure of the air current formed in the air current virtual region for each of the lattice segments;

(D) integrating the speeds, directions and pressures of the air current calculated for the individual lattice segments to calculate a lift coefficient and a drag coefficient of the golf ball in the air current virtual region in which the air current is generated;

(D-1) repetitively carrying out the operations of (A) to (D) changing the number of rotations of the ball and the speed of the air current and mapping lift coefficients and drag coefficients of the golf ball at the number of rotations of the ball and the speeds of the air current obtained thereby to produce a reference map in advance;

(D-2) deciding the lift coefficient and the drag coefficient at a predetermined number of rotations and a predetermined speed from the reference map;

(E) calculating the flight distance, variation in height and speed of the ball after the golf ball flies for the very short period of time under the gravity from the lift coefficient and the drag coefficient and calculating the number of rotations of the ball after the flight for the very short period of time; and (F-1) setting the calculated number of rotations and the calculated speed as the speed of rotation and the speed after lapse of the very short period of time;

the operations of (D-2), (E) and (F-1) being repeated so that the flight distance and the height of the ball after every lapse of the very short period of time after the ball is hit to fly until the ball drops to the ground are successively calculated to estimate the ballistic trajectory.

8. A flight simulation method for a golf ball, comprising a step of analyzing the flowing direction and the speed of an air current around the golf ball which flies along a ballistic trajectory obtained by the ballistic trajectory simulation method according to claim 7 by visualizing the flowing direction and the speed of the air current around the golf ball with a vector direction and a length, respectively, after every lapse of the very short period of time.

9. A flight simulation method for a golf ball, comprising a step of analyzing the pressure distribution by an air current around the golf ball which flies along a ballistic trajectory obtained by the ballistic trajectory simulation method according to claim 7 by visualizing the pressure distribution of the air current around the golf ball model with a constant pressure line or a constant pressure plane after every lapse of the very short period of time.

10. A flight simulation method for a golf ball, comprising a step of analyzing the vorticity distribution by an air current around the golf ball which flies along a ballistic trajectory obtained by the ballistic trajectory simulation method according to claim 7 by visualizing the vorticity distribution of the air current around the golf ball model with a constant value line or a constant value plane after every lapse of the very short period of time.

11. A flight simulation method for a golf ball, comprising a step of analyzing the streamlines, path lines, particle traces or volume renderings by an air current around the golf ball which flies along a ballistic trajectory obtained by the ballistic trajectory simulation method according to claim 7 by visualizing the streamlines, path lines, particle traces or volume renderings of the air current around the golf ball model with a constant pressure line or a constant pressure plane after every lapse of the very short period of time.

12. A method of producing a reference map for use in a ballistic trajectory simulation method for analyzing a ballistic trajectory when a golf ball having a plurality of dimples formed on the surface thereof is hit to fly making use of arithmetic operation by a computer, the producing the reference map comprising the steps of:
calculating a lift coefficient and a drag coefficient corresponding to a speed and a rotational speed at each of a plurality of points at which the speed and the rotational speed are changed within a necessary range in advance with regard to the speed and a number of rotations of the golf ball necessary to simulate the ballistic trajectory of the ball; and
mapping the lift coefficient and the drag coefficient of the golf ball at each of the numbers of rotations of the ball and each of the speeds of the air current determined by a calculation in a space which has an X axis of the speed, a Y axis of the number of rotations and a Z axis of at least one of the lift coefficient and the drag coefficient.

\* \* \* \* \*